United States Patent [19]

Osipov et al.

[11] 4,453,916
[45] Jun. 12, 1984

[54] DEVICE FOR FUSION OF ELECTRODEPOSITED COATING OF PRINTED-CIRCUIT BOARDS

[76] Inventors: Anatoly A. Osipov, ulitsa Eizenshteina, 6, kv. 39; Vladimir V. Pomazkov, ulitsa Godovikova, 1, korpus 1, kv. 109; Nikolai S. Pekov, ulitsa B. Mariinskaya, 2, kv. 77; Anatoly S. Dubovik, ulitsa Bazhova, 4, kv. 87; Mikhail F. Tregubenko, ultisa Shturvalnaya, 3, korpus 2, kv. 301; Jury L. Shvorobei, ulitsa Guryanova, 3, kv. 45; Grigory I. Dashevsky, ulitsa Vishnyakovskaya, 41, korpus 2, kv. 78; Vladimir A. Iovlev, lazorevy proezd, 16, kv. 47, all of Moscow, U.S.S.R.

[21] Appl. No.: 397,511

[22] Filed: Jul. 12, 1982

[51] Int. Cl.³ .................. F27B 15/00; F24H 3/02; C25D 17/00; B23K 31/02
[52] U.S. Cl. .................................... 432/197; 165/120; 204/198; 228/180 R
[58] Field of Search ....... 432/197; 165/120, DIG. 26; 204/198, 199; 228/180 R

[56] References Cited

U.S. PATENT DOCUMENTS 2,433,094 12/1947 Crowley .......................... 165/120
4,306,857 12/1981 Hofstetter et al. ............... 432/197

*Primary Examiner*—John J. Camby
*Attorney, Agent, or Firm*—Steinberg & Raskin

[57] ABSTRACT

There is proposed a device for fusion of electrodeposited coatings of printed-circuit boards, comprising a means to impart a desired direction to the flow of a heat-transfer agent, and a mechanism for traversing the boards being handled. According to the invention, said means to impart a desired direction to the flow of the heat-transfer agent is made as a chamber having an inlet and an outlet for the heat-transfer agent to come in and come out, respectively, and openings for the boards to pass across the direction of flow of the heat-transfer agent, while the traversing mechanism is accommodated inside the chamber.

6 Claims, 4 Drawing Figures

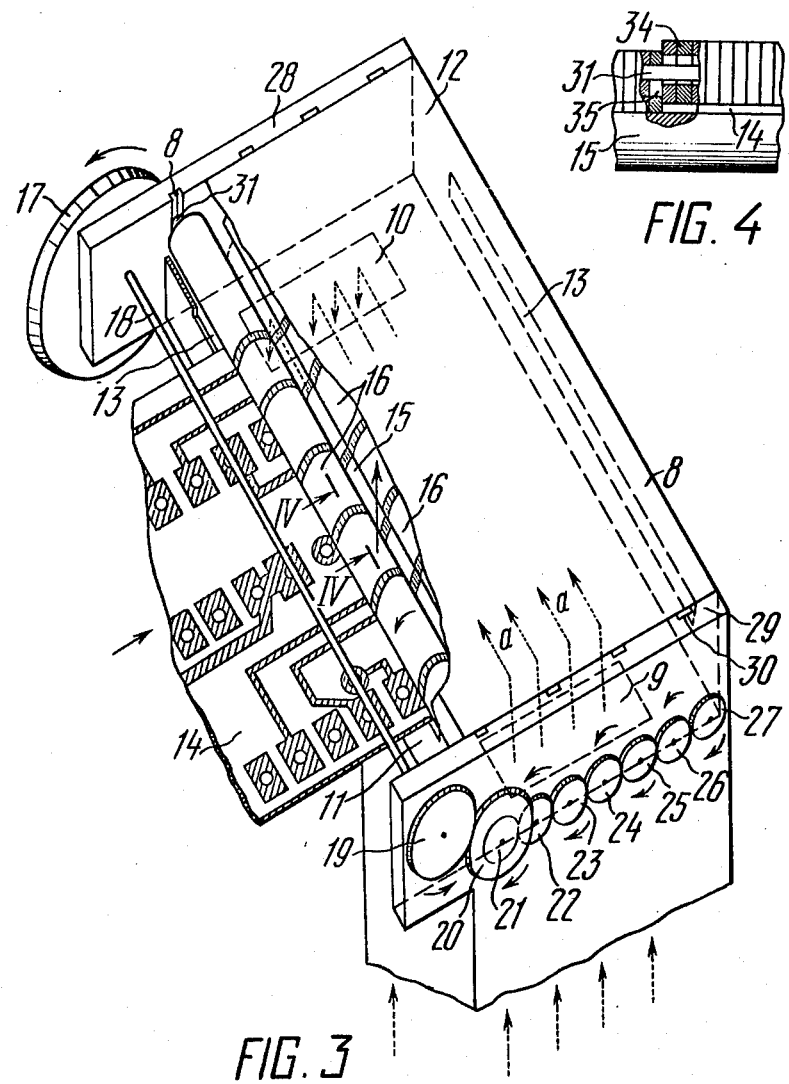

DEVICE FOR FUSION OF ELECTRODEPOSITED COATING OF PRINTED-CIRCUIT BOARDS

BACKGROUND OF THE INVENTION

The present invention relates generally to production techniques of radio-engineering equipment, and more specifically to devices for fusion of electrodeposited coatings of printed-circuit boards.

The invention can find most utility when applied for fusion of electrodeposited coatings on printed-circuit boards used in radio-engineering circuits. In addition, the invention is applicable for fusion of electroplating on flat structural components of equipment subject to soldering during subsequent assembling.

Known in the present state of the art is a device for fusion electrodeposited coatings of boards, comprising a bath with a heat-transfer agent, a mechanism for establishing a flow of the heat-transfer agent, a means for imparting a desired direction to the flow of the heat-transfer agent, and a mechanism for traversing the boards being handled through said means.

The means for imparting a desired direction to the flow of the heat-transfer agent is made as a pair of intercommunicating pipings arranged horizontally one above the other and having the heat-transfer agent outlet fittings facing each other.

The mechanism for establishing a flow of the heat-transfer agent in the bath is essentially a pump with an impeller and a drive electric motor.

The mechanism for traversing the boards being handled is made as a screen conveyer having stops for the boards being handled, the top (carrying) strand of the conveyer passing between said pipings, while its bottom (return) strand runs underneath the bath.

The board on which the electroplating is to be fused is put onto the conveyer, having preliminarily adjusted the stops thereon to suit the length of the board being handled. When carried by the conveyer the board is transferred into the zone of action of the heat-transfer agent, which is pumped from the bath into the piping. While leaving the outlet fittings the heat-transfer agent preheated in the bath, is splashed over the top and bottom board surfaces as along the direction of the board run on the conveyer, thus fusing the electroplating on the board.

However, the construction of the device described above fails to provide high-quality fusion, inasmuch as it cannot stabilize the time-dependent temperature characteristics of the heat-transfer agent involved in treatment of boards.

Splashing of the heat-transfer agent over the board surface during the board treatment results in rapid cooling of the heat-transfer agent, so that the operation of the device is to be stopped from time to time for the heat-transfer agent to acquire a preset temperature in the bath.

In the course of operation the heat-transfer agent is liable to be vigorously oxidized by the atmospheric oxygen, while the crystallization process is not stabilized due to the fact that the construction of the device fails to prevent the heat-transfer agent from running onto the already treated board.

In addition, to proceed to handling the boards of another type-and-size also involves stopping of the device for readjustment of the stops on the conveyer.

Apart from the disadvantages mentioned above the construction of the device is not suitable for fusing flexible boards without additional fixtures for their holding in position during treatment nor is it capable of processing differently shaped and sized boards for a single technological cycle.

SUMMARY OF THE INVENTION

It is therefore a primary and essential object of the present invention to provide a device for fusion of electrodeposited coatings of printed-circuit boards, which would be capable of attaining high-quality fusion of electroplating of such boards featuring different configuration and thickness.

Said and other objects of the invention are accomplished by the provision of a device for fusion of electrodeposited coatings of printed-circuit boards, comprising a bath containing a heat-transfer agent, a mechanism for establishing a flow of the heat-transfer agent in the bath, a means for imparting a desired direction to the flow of the heat-transfer agent, and a mechanism for traversing the boards through said means, wherein according to the invention, the means for imparting a desired direction to the flow of the heat-transfer agent is made essentially as a closed chamber having an inlet and an outlet fitting for the heat-transfer agent to come in and come out, and openings for the boards to pass, said openings being made in the opposite chamber walls and being arranged square with the direction of flow of the heat-transfer agent, and the mechanism for traversing the boards is accommodated in the above-mentioned chamber.

High-quality fusion of the electroplating of the boards being treated, i.e., obtaining of a bright, uniform, solid coating of a poreless structure is attained due to optimum time-dependent temperature parameters of the heat-transfer agent established in the closed chamber and simultaneous treatment of both sides of the plate being handled with the heat-transfer agent under constant and vigorous recirculation, as well as due to continuously equalized temperature of the heat-transfer agent throughout the volume of the chamber attained thanks to the fact that the mechanism for traversing the boards under processing is accommodated inside the chamber in a continuous flow of the heat-transfer agent.

Minimized running of the heat-transfer agent onto the board while the latter is entering the chamber and is discharging therefrom is accounted for by the fact that the direction of the board traverse through the chamber is square with the direction of flow of the heat-transfer agent into the chamber. This rules out any thermal effect of the heat-transfer agent on the already treated board, thus stabilizing the crystallization process of the electroplating thereon.

It is expedient that the board traversing mechanism be made as rolls arranged in pairs one above the other, the bottom rolls being the driven ones to impart transverse motion to the boards across the flow of the heat-transfer agent, while the top rolls are vertically traversable to establish a gap for the different-thickness boards to pass in between the rolls.

Such a constructional arrangement of the board traversing mechanism makes it possible to effect continuous equalization of the temperature of the heat-transfer agent throughout the volume of the chamber, forasmuch as the rolls of the mechanism are situated in a continuous flow of the heat-transfer agent and serve as heat accumulators. Moreover, the afore-described construction of the mechanism enables flexible boards to be fused without holding them in position during traversing.

Stabilized temperature conditions of the fusion chamber are attained also due to the fact that the zone of thermal effect on the chamber is confined within the first and last rolls as along the direction of run of the board being processed.

It is also favourable that vertical slots be made in the opposite walls of the chamber to receive the shafts of the top rolls with a possibility for the rolls to rotate and traverse vertically. This makes it possible to process different-thickness boards for a single cycle without additional readjustment of the board traversing mechanism.

It is likewise practicable that the top rolls be made sectionalized, i.e., composed of a plurality of disks vertically traversable with respect to one another for the different-width boards to pass. Such a construction of the top rolls prevents the heat-transfer agent from flowing out of the chamber when handling the boards that are much narrower than the openings for their passing.

The disks forming the top rolls are reasonable to be set loosely on the shafts of said rolls. This provides for a possibility of treating the boards of different thickness, width and shape for a single technological cycle without vertical readjustment of the top rolls, since the disks constituting these rolls are raised only when interacting with the boards being handled so that the amount of the gap between the shafts of the top rolls and the inside diameter of the disks should correspond to the maximal thickness of the board being handled.

Furthermore, it is advantageous that the openings in the chamber walls for the boards to pass lie in a plane passing through the line of contact of the rolls with each other.

Such an arrangement of the openings makes it possible to dispense with holding of the boards to the conveyer during their processing in the fusion chamber, since the board being handled rests, irrespective of its thickness, upon the bottom rolls, which cannot traverse vertically and assume a strictly fixed position with respect to the openings in the chamber walls.

BRIEF DESCRIPTION OF THE DRAWINGS

In what follows the present invention will be illustrated by a detailed description of a specific embodiment thereof with reference to the accompanying drawings, in which:

FIG. 3 is a general scaled-up perspective view of a means for imparting a desired direction to the flow of a heat-transfer agent, made as a closed chamber, according to the invention; and FIG. 4 is a section taken along the line IV—IV of FIG. 3 to illustrate the unit of interaction of the top roll made up of disks, with the bottom roll and the board being handled.

DETAILED DESCRIPTION OF THE PREFERRED EMBODIMENT

Figure 1:
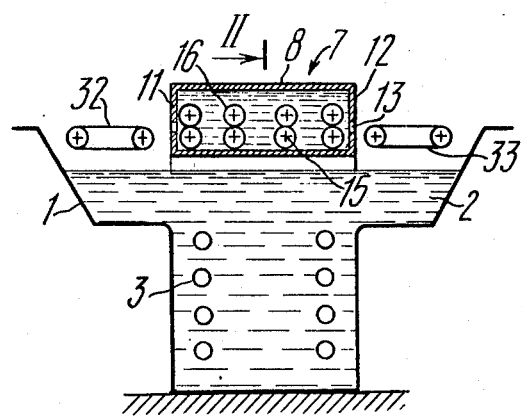
FIG. 1 is a general schematic cross-sectional view of a device for fusion of electrodeposited coatings of printed-circuit boards, according to the invention.
Figure 2:
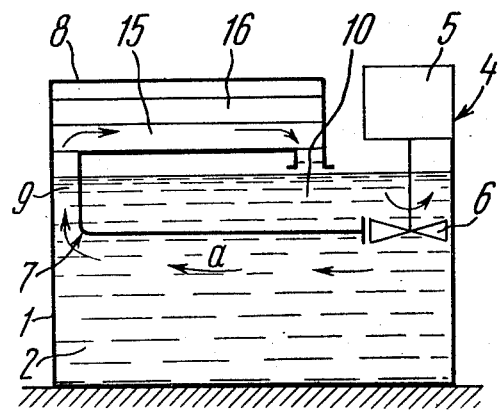
FIG. 2 is a section taken along the line II—II of FIG. 1.

The device for fusion of electrodeposited coatings of printed-circuit boards comprises a bath 1 (FIG. 1) containing a heat-transfer agent 2 and a heater element 3. The device has also a mechanism 4 (FIG. 2) for establishing a flow of the heat-transfer agent in the bath (said flow being indicated with the arrows 'a' in FIGS. 2 and 3). The mechanism 4 is made up of an electric motor 5 and an impeller 6. In addition, the proposed device comprises a means 7 (FIGS. 1, 2) for imparting a desired direction to the flow of the heat-transfer agent, and a mechanism for carrying the boards through said means 7.

The means for imparting a desired direction to the flow of the heat-transfer agent is made as a chamber 8 closed on every side and having an inlet 9 and an outlet 10 for the heat-transfer agent to come in and come out, respectively, and openings 13 made in the opposite walls 11, 12 (FIGS. 1, 3) of the chamber 8 and arranged across the direction of flow of the heat-transfer agent, for boards being handled to pass, e.g., a printed-circuit board 14 (FIGS. 3, 4).

The board traversing mechanism is accommodated inside the chamber 8 and incorporates bottom rolls 15 and top rolls 16 arranged in pairs one above the other.

The bottom rolls 15 are driven from a sprocket 17, which imparts rotation via a shaft 18 to gear wheels 19, 20, 21, 22, 23, 24, 25, 26, 27 rigidly secured on the bottom rolls 15. Rotation to the sprocket 17 is imparted by a chain drive (not shown).

The top rolls 16 are vertically traversable to establish a gap for the different-thickness boards 14 to pass in between the rolls 15 and 16. This is made possible due to the fact that vertical slots 30 are provided in opposite walls 28 (FIG. 3) and 29 of the chamber 8 to receive shafts 31 of the top rolls 16 so as to render the latter rolls rotatably and vertically traversable.

The openings 13 in the walls of the chamber 8 lie in a plane passing through the line of contact of the rolls 15 and 16 with each other. Provided at the inlet and outlet openings 13 are respectively a conveyer 32 (FIG. 1) to feed the boards 14 into the chamber 8 and a conveyer 33 to discharge the boards 14 from the chamber 8.

Each of the top rolls 16 is sectionalized (FIG. 4) and made up of a plurality of disks 34 set on the shaft 31 with a clearance 35 so as to allow the disks 34 to traverse vertically with respect to one another for the different-width boards 14 to pass.

The device of the invention operates as follows.

The beforehand flux-coated printed-circuit board 14 is put on the feed conveyer 32, which transfers the board 14 to the inlet opening 13 of the chamber 8. The board 14 is caught by the pairs of the rotary rolls 15 and 16, which draw the board to the next pair of the rolls. The top rolls 16 are raised along the slots 30 in the walls 28, 29 for distance equal to the thickness of the board 14. The first top roll 16 as in the direction of the board travel, lies down onto the board surface, thus preventing the heat-transfer agent 2 from running onto the board portion that still remains beyond the chamber 8.

The heat-transfer agent 2 continuously recirculating in the chamber 8, flows by the board 14 uniformly and simultaneously on its every side when the board is traversing between the rolls 15 and 16. The temperature field within the chamber 8 is uniform through the entire volume thereof, since the heat-transfer agent is recirculating constantly inside the chamber 8, and the contact of the heat-transfer agent with the atmospheric is minimized. Besides, as the rolls 15 and 16 are continuously situated in the zone of action of the heat-transfer agent 2, they serve as heat accumulators to equalize the temperature thereof.

The rolls 15 and 16 carry the board 14 through a continuous flow of the heat-transfer agent 2 across the direction of motion of the latter and bring the board 14 outwards onto the board discharge conveyer 33. Once the board 14 has been withdrawn from the chamber 8 the last top roll 16 (as in the direction of the board travel) moves down onto the roll 15, thus closing the opening 13 and preventing the heat-transfer agent 2 from running onto the already processed board 14. This stabilizes the process of crystallization of the fused electroplate coating.

The flow 'a' of the heat-transfer agent 2, on passing through the chamber 8, returns to the bath 1 via the outlet 10.

When no boards 14 are present in the chamber 8, the extreme rolls 15 and 16 are in an intimate contact with each other and the heat-transfer agent is practically prevented from flowing out through the openings 13, as the flow 'a' of the heat-transfer agent 2 moves along the rolls 15 and 16 in the chamber 8.

When treated in the chamber 8 is the board 14 (FIG. 4), which is much narrower than the opening 13, the disks 34 on the stationary fixed shaft 31 are raised above the board 14 due to the clearance 35, while the disks 34 not in contact with the board 14 being handled remain tightly pressed against the bottom roll 15 by its own mass. This also contributes to preventing the flowing of the heat-transfer agent out of the chamber 8.

The device for fusion of electrodeposited coatings of printed-circuit boards is in fact the one featuring extended functional capabilities, inasmuch as it is in the first time in the engineering practice that there is provided high-quality fusion of multi- and single-layer printed-circuit boards of low thicknesses (0.1 to 0.3 mm), including flexible boards, of any length and configuration.

Apart from that the device features high output as it operates on a continuous cycle due to ruled out stopping for readjustment and equalization of the heat-transfer agent.

What is claimed is:

1. A device for fusion of electrodeposited coatings on printed circuit boards, comprising a receptacle containing a heat transfer medium;
means for conveying flow of the heat transfer medium out of said receptacle;
means for imparting a desired flow direction to the heat transfer medium, comprising
   a chamber provided with first inlet and outlet openings for the heat transfer medium to pass through said chamber in the desired flow direction, and further provided with second inlet and outlet openings for the boards to pass through said chamber, said first and second openings situated to define substantially transverse directions of passage of the heat transfer medium and of the boards through said chamber; and
means for conveying the boards through said chamber, comprising
   cooperatively acting top and bottom roll means,
   said bottom roll means comprising means for conveying the boards substantially transversely relative to the direction of heat transfer medium flow, and
   said top roll means mounted for movement in a direction substantially vertically, to allow boards of different thicknesses to pass between said respective top and bottom roll means.

2. The device of claim 1, wherein opposite walls of said chamber are provided with vertical slots to receive axes of said top roll means for rotational and vertical movement thereof.

3. The device of claim 2, wherein said top roll means comprises a plurality of roll discs mounted for rotational and vertical movement to prevent leakage of the heat transfer medium from said chamber when boards of varying thicknesses pass therethrough.

4. The device of claim 3, wherein said discs defining said top roll means are loosely mounted on the axes of said top roll means.

5. The device of claim 4, wherein clearances are provided between respective axes and discs.

6. The device of claim 1, wherein said second openings lie in a plane passing through a line of contact of said top roll means and said bottom roll means.

* * * * *